United States Patent [19]

Williams

[11] 3,811,098

[45] May 14, 1974

[54] TRANSFORMERLESS FULL WAVE RECTIFIER AND DIRECT COUPLED PRODUCT MODULATOR

[75] Inventor: Arthur B. Williams, Smithtown, N.Y.

[73] Assignee: The Singer Company, Little Falls, N.J.

[22] Filed: Feb. 5, 1973

[21] Appl. No.: 329,622

[52] U.S. Cl. .................... 332/44, 307/230, 307/260, 321/8 R, 328/26, 329/166, 332/31 T

[51] Int. Cl. ................................................ H03c 1/52

[58] Field of Search .................. 332/43 B, 44, 31 T; 307/230, 260, 261; 328/26; 321/8 R; 329/166

[56] References Cited

UNITED STATES PATENTS

| | | | |
|---|---|---|---|
| 3,551,850 | 12/1970 | Rudolph et al. | 332/44 |
| 3,564,387 | 2/1971 | Gadberry | 328/264 |
| 3,582,675 | 6/1971 | Jordan et al. | 307/230 |

OTHER PUBLICATIONS

Riso "Transformerless Modulator," Vol. 12, No. 3 – IBM Technical Disclosure Bulletin, p. 368–369, Aug. 1969

*Primary Examiner*—Alfred L. Brody
*Attorney, Agent, or Firm*—T. W. Kennedy

[57] ABSTRACT

A circuit which in one configuration may be used as a rectifier and in another configuration as a direct coupled product modulator comprising a pair of transistors coupled to the input, a first integrated circuit amplifier controlling the transistors and a second integrated circuit amplifier obtaining its input inverting input from one transistor and its non-inverting input from the other and providing the final output is shown. In the rectifier configuration the signal to be rectified is applied to both the two transistors and the first amplifier with the amplifier output selectively grounding a respective one of the transistors on respective positive and negative cycles causing the second amplifier to output a uni-polar signal. In the modulator configuration the carrier is applied to the first amplifier and will modulate the signal input to the transistors through similar grounding action. Both configurations are able to handle small signals and provide variable gain a feature not present in prior art devices using transformers.

7 Claims, 3 Drawing Figures

TRANSFORMERLESS FULL WAVE RECTIFIER AND DIRECT COUPLED PRODUCT MODULATOR

BACKGROUND OF THE INVENTION

This invention relates to electronic circuits in general, and more particularly to an improved full wave rectifier which may also be used in a different configuration as a direct coupled product modulator.

In the prior art rectification was generally accomplished through the use of a transformer and diode rectifier circuits. Although for most applications this type of rectifier works extremely well, it does have certain drawbacks. The circuit has no gain adjustment capability. Therefore, the DC output voltage is related only to the AC input voltage and to ratio of the transformer used. Another drawback of such diode circuits is that the minimum level that can be rectified is a level which is greater than the diode voltage drops. Thus such rectifiers are not capable of directly rectifying very small AC voltages.

Previous modulators which have been used to multiply a signal by a carrier frequency have generally been in the nature of ring modulators. In such a circuit three transformers are usually required, one for the input, one for the output and one for the carrier. The input and output transformers require accurate center taps resulting in high costs. Because transformers are generally bulky, such construction inhibits circuit miniaturization, also, the frequency response of the circuit is severely limited to the frequency response of transformer. In addition, the ring modulator circuit, which also uses diodes, usually requires compensation for unbalancing which results due to diode differences and transformer unbalance.

Thus, it can be seen that there is a need for a circuit that can perform the functions of rectification and modulation described above and which also can be packaged in a miniaturized configuration.

SUMMARY OF THE PRESENT INVENTION

The present circuit utilizes a pair of integrated circuit amplifiers and a pair of transistors to perform the rectifying function. The first integrated circuit amplifier is used to switch the two transistors in and out, one being switched in during the positive cycle and the other during the negative cycle, each of the transistors having the input signal applied to their emitters. The output of the two transistors is then provided to the second amplifier which, on alternate positive and negative cycles, will go from being a non-inverting to an inverting amplifier and will provide as its output a full wave rectified signal. By slightly modifying the circuit and applying a signal to the transistors and a carrier to the first amplifier, a modulator that multiplies the input signal by a carrier frequency is obtained. In the absence of a DC component in the input signal the carrier frequency can be almost completely suppressed at the modulator outpt thus producing a double side band suppressed carrier output signal.

FIGURE DESCRIPTIONS

DETAILED DESCRIPTION OF THE PREFERRED EMBODIMENT

Figure 1:
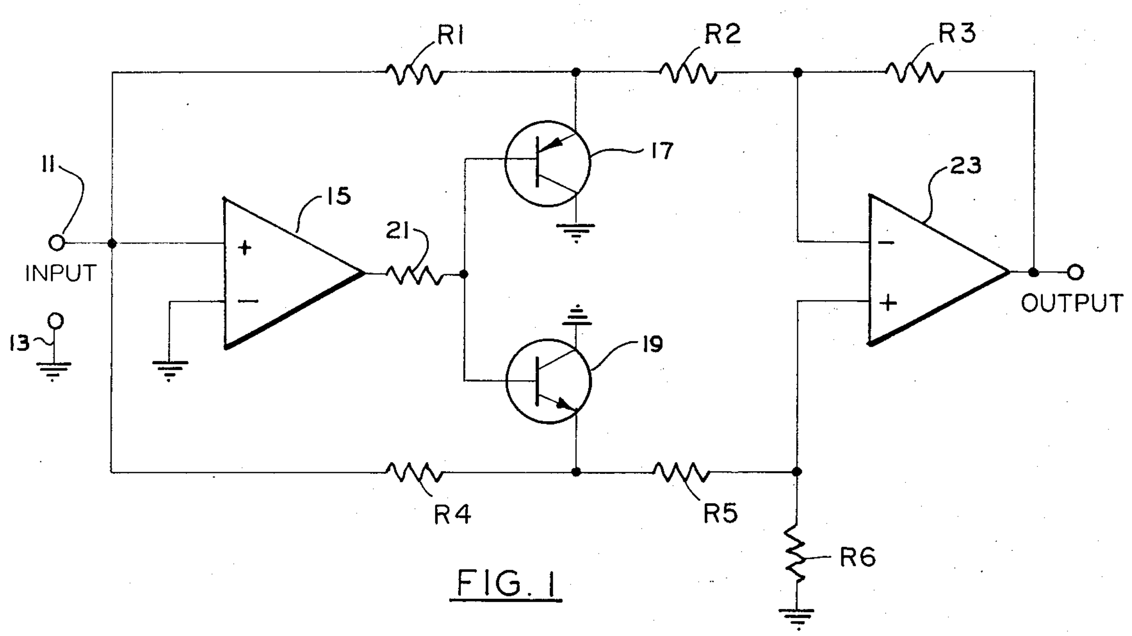
FIG. 1 is a circuit diagram of the circuit configured as a rectifier.

In the circuit of FIG. 1 the input signal is provided between an input terminal 11 and ground terminal 13. The input is provided to an integrated circuit differential amplifier 15 and to the emitters of a transistor 17 and a transistor 19 through respective resistors R1 and R4, each having a relative value designated as R. Transistors 17 and 19 each have their collectors grounded and their bases connected through a resistor 21 to the output of amplifier 15. Transistor 17 is a PNP transistor and transistor 19 is an NPN transistor. The emitter of transistor 17 is also connected through a resistor R2 to the inverting input of an integrated circuit amplifier 23. The emitter of transistor 19 is similarly coupled through a resistor R5 to the non-inverting input of amplifier 23. Each of the resistors R2 and R5 also have a relative value equal to R. A feedback resistor R3 having a value equal to 2 AR is provided between the output of amplifier 23 and its inverting input. A resistor R6 having a relative value $2\ AR/A+1$ is connected between the non-inverting input amplifier 23 and ground.

The input at terminal 11 can be either positive or negative with respect to ground 13 depending on whether the AC input signal is in its positive or negative cycle. If the signal is positive, the output of amplifier 15 will similarly be positive turning on transistor 19 and thus grounding its emitter, causing the non-inverting input of amplifier 23 to be at ground. The signal will be provided through $R1$ and $R2$ to the inverting input of amplifier 23 and will appear at its output inverted. The gain of amplifier 23 is equal to Output/Input $= R_3/R_1 + R_2 = -2AR/R+R = -A$. This gain, minus A, may be adjusted by adjusting resistor R3 and/or resistors R1 and R2 to obtain the proper scaling from input to output. For example, if the maximum input value of the AC voltage at input 11 was, for example, 100 millivolts, and an output of 1 volt was desired, the gain could be set at 10. In that case $R3$ would have a value 20 times that of $R1$ and $R2$. It should be noted that the conventional rectifier using transformers and diodes could not handle a voltage this small since this voltage would not overcome the diode voltage. Also, it should be noted that by varying the value of the resistors various gains may be obtained in the system. With a negative input at terminal 11, the amplifier 15 will have a negative output which will turn on transistor 17 causing its emitter to be effectively at ground. The input voltage will now be provided through resistors R4 and R5 to the non-inverting input of amplifier 23. The amplification is this case will be $$\text{Output/Input} = [(R_3/R_2)+1]\ [R_6/R_4+R_5+R_6] = [(2\ AR/R)+1]\ [(2\ AR/A+1)/R+R+(2\ AR/A+1)\ ]$$

$$= [2\ AR/2R\ \ (A+1)+2\ AR]\ [2\ A+1]$$

$$= [A/A+1+A]\ [2\ A+1]$$

$$= [A/2\ A+1]\ [2\ A+1] = A$$

Thus, a negative input is amplified by $+A$ and a positive input by $-A$, making the output always negative and accomplishing a full wave rectification. It should be noted that the inputs may be reversed at any point in the circuit in order that a positive output may be obtained in a well known manner.

The integrated circuits may be those in the 709/741 series manufactured by Fairchild semi-conductors or other equivalent amplifiers. The transistors may be any of a number of silicon transistors which operate as switches. The resistors to obtain accurate circuit performance should be precision resistors.

Figure 2:
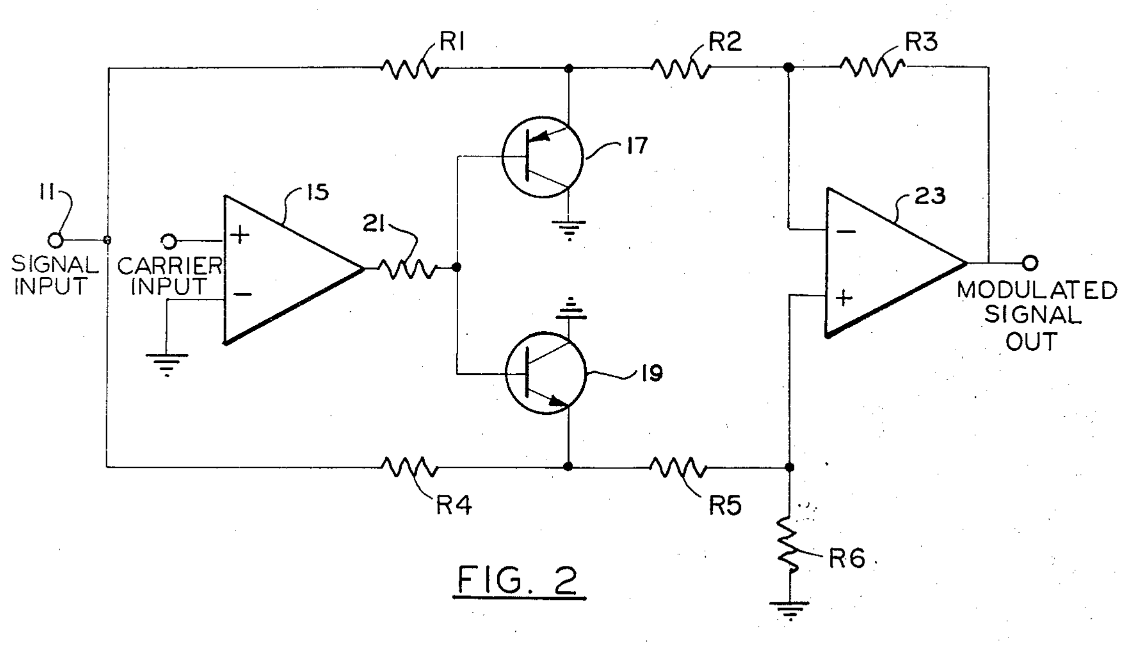
FIG. 2 is a circuit diagram of the circuit configurated as a product modulator.

The configuration of the circuit to provide a modulator which will multiply the input signal by a carrier frequency is shown on FIG. 2. The only difference is that now the signal input is not provided to amplifier 15 but instead a carrier input is applied thereto. With this arrangement transistor 19 will be turned on during the positive cycle of the carrier input and transistor 17 will be turned on during the negative cycle of the carrier input.

Figure 3:
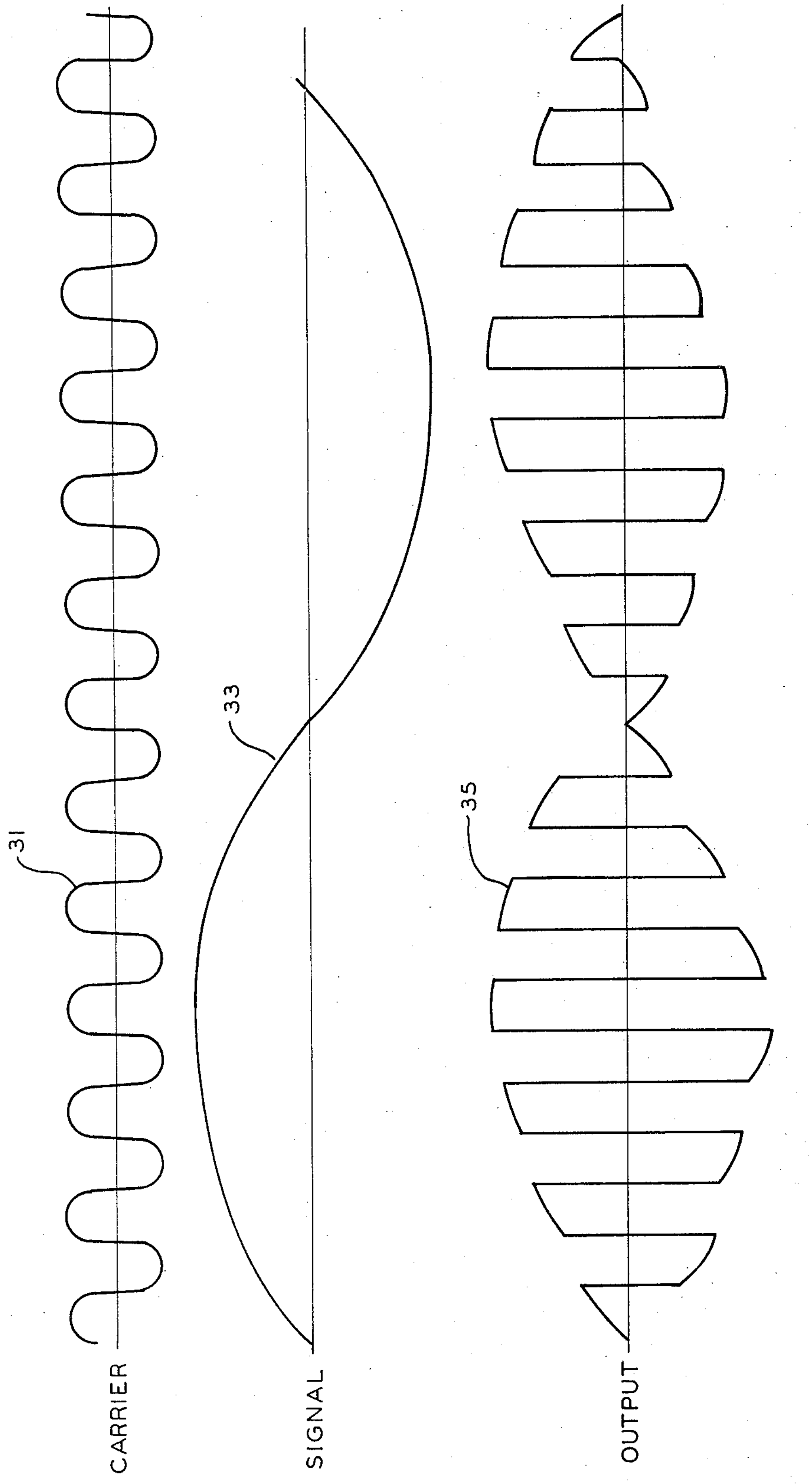
FIG. 3 is a waveform diagram illustrating the operation of the circuit of FIG. 2.

The waveforms at the various points of the circuits are shown in FIG. 3. Waveform 31 represents the carrier input to amplifier 15. Waveform 33 is the signal input to terminal 11 and waveform 35 is the signal output from amplifier 23. The signal, during each negative cycle of the carrier, will be provided at the output non-inverted and during each positive cycle will be provided at the output inverted. The resulting output 35 is a double side band suppressed carrier signal. If the circuit is properly constructed using precision resistors, carrier suppression superior to that found in the conventional ring modulator can be obtained without requirement for any balancing adjustments. The circuit has the additional feature of the ability to change the gain of the output not present in the prior art circuit. In addition, the circuit can be miniaturized and may even be constructed using hybrid technology on a single chip. The frequency response of the circuit is not limited by any transformer characteristics but only by the frequency limitations on the amplifier, which in present day operational amplifiers, far exceed that attainable using transformers.

Thus, a circuit, which in one configuration, provides a rectifier capable of rectifying small signals and of providing variable gain and which, in another configuration, provides a product modulator, also having variable gain, without the use of transistors and which lends itself to miniaturization has been shown. Although specific embodiments have been illustrated and described it will be recognized by those skilled in the art that various modifications may be made without departing from the spirit of the invention which is intended to be limited solely by the appended claims.

What is claimed is:

1. A full wave rectifier comprising:

a. an input terminal;

b. a differential amplifier having its non-inverting terminal coupled to said input terminal and its inverting input terminal coupled to ground;

c. a PNP transistor having its emitter coupled through a resistor to said input terminal, its collector grounded and its base coupled to the output of said differential amplifier;

d. an NPN transistor having its emitter coupled through a second resistor to said input terminal, its collector coupled to ground and its base coupled to said differential amplifier;

e. an operational amplifier having its inverting input coupled through a third resistor to the emitter of said PNP transistor and through a fourth resistor to its output, and having its non-inverting input coupled through a fifth resistor to the emitter of said NPN resistor and through a sixth resistor to ground.

2. The invention according to claim 1 wherein said first, second, third and fifth resistors have a relative value $R$, said fourth resistor has a relative value 2 AR and said sixth resistor has a relative value $2\ AR/A + 1$ where $A$ is equal to the amplification of said operational amplifier.

3. The invention according to claim 1 wherein said differential amplifier and said operational amplifier are microcircuit amplifiers.

4. A modulator for modulating a carrier by a signal comprising:

a. a signal input terminal;

b. a differential amplifier having its inverting input grounded and the carrier signal provided to its non-inverting input;

c. a PNP transistor having its emitter coupled through a resistor to said input terminal, its collector grounded and its base coupled to the output of said differential amplifier;

d. an NPN transistor having its emitter coupled through a second resistor to said input terminal, its collector coupled to ground and its base coupled to said differential amplifier;

e. an operational amplifier having its inverting input coupled through a third resistor to the emitter of said PNP transistor and through a fourth resistor to its output, and having its non-inverting input coupled through a fifth resistor to the emitter of said NPN resistor and through a sixth resistor to ground.

5. The invention according to claim 4 wherein said first, second, third and fifth resistors have a relative value $R$ and said fourth resistor has a relative value 2 $AR$ and said sixth resistor has a relative value $2\ AR/A + 1$ where $A$ is equal to the amplification of said operational amplifier.

6. The invention according to claim 4 wherein said differential amplifier and said operational amplifier are microcircuit amplifiers.

7. The invention according to claim 4 wherein said first, second, third, fourth, fifth and sixth resistors are all precision resistors.

* * * * *